Dec. 16, 1969 B. EASTER 3,484,711

MICROWAVE AMPLIFIERS UTILISING TUNNEL DIODES
OR OTHER NEGATIVE-RESISTANCE ELEMENTS

Filed April 29, 1966 2 Sheets-Sheet 1

INVENTOR
BRIAN EASTER
BY
Kirschstein, Kirschstein & Ottinger
ATTORNEYS

INVENTOR
BRIAN EASTER
BY
Kurt Kelman, Kurt Kelman & Ottinger
ATTORNEYS

United States Patent Office 3,484,711
Patented Dec. 16, 1969

3,484,711

MICROWAVE AMPLIFIERS UTILISING TUNNEL DIODES OR OTHER NEGATIVE-RESISTANCE ELEMENTS

Brian Easter, Llangefni, Anglesey, Wales, assignor to The General Electric and English Electric Companies Limited, London, England, a company of Great Britain Filed Apr. 29, 1966, Ser. No. 546,259
Int. Cl. H03f 15/00
U.S. Cl. 330—61 4 Claims

ABSTRACT OF THE DISCLOSURE

A microwave amplifier has a tunnel diode amplifier unit in which D.C. bias is applied to the tunnel diode by way of a length of two-conductor transmission line which is terminated by lossy material. This arrangement ensures that the biasing arrangement for the diode is adequately bypassed at the frequency of signals to be handled by the diode while ensuring stable operation of the amplifier. The amplifier unit, a microwave source and a load are interconnected by way of a three-port circulator. In the amplifier unit the tunnel diode is effectively connected across a two-conductor transmission line which provides the input/output path of the unit while a short-circuited stub line is connected in parallel with the tunnel diode so as to compensate for the inherent susceptance of the tunnel diode. A further stub line may be connected to the input/output path between the tunnel diode and the circulator at a point spaced a quarter wavelength from the previous stub line so as to increase the operational bandwidth of the amplifier.

This invention relates to microwave amplifiers utilising tunnel diodes or other negative-resistance elements and is particularly, although not exclusively, concerned with amplifiers for use at frequencies in excess of one thousand megacycles per second. It is well known that a tunnel diode has the property of negative resistance over part of its voltage/current characteristic and it has been proposed to connect a tunnel diode to one port of a circulator so as to provide amplification between input and output paths connected respectively to two other ports.

For a tunnel diode to operate on the negative resistance part of its characteristic, it is necessary for it to be connected to a suitable direct current source that supplies a steady bias voltage to the diode. It is however essential that the biasing arrangement shall be adequately bypassed at the frequency of signals to be handled by the tunnel diode (which is itself a relatively low impedance device) whilst ensuring stable operation of the amplifier. One object of the present invention is to provide an amplifier in which these requirements are satisfied.

According to the present invention, a microwave amplifier has a tunnel diode or other negative-resistance element connected in series with a direct current blocking capacitor between the conductors of a two-conductor transmission line, the capacitor comprising an auxiliary two-conductor transmission line and the end of this auxiliary line remote from the diode or other element being terminated by a mass of lossy material, a conductor for supplying bias voltage to the diode or other element passing through the said mass of lossy material and being electrically connected to one of the conductors of the auxiliary line.

Figure 4:
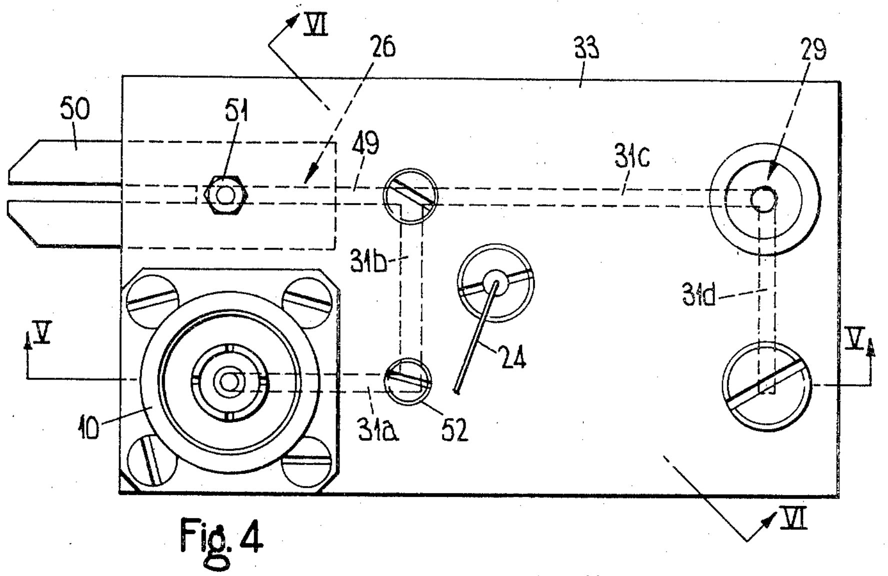
Figures 5, 6:
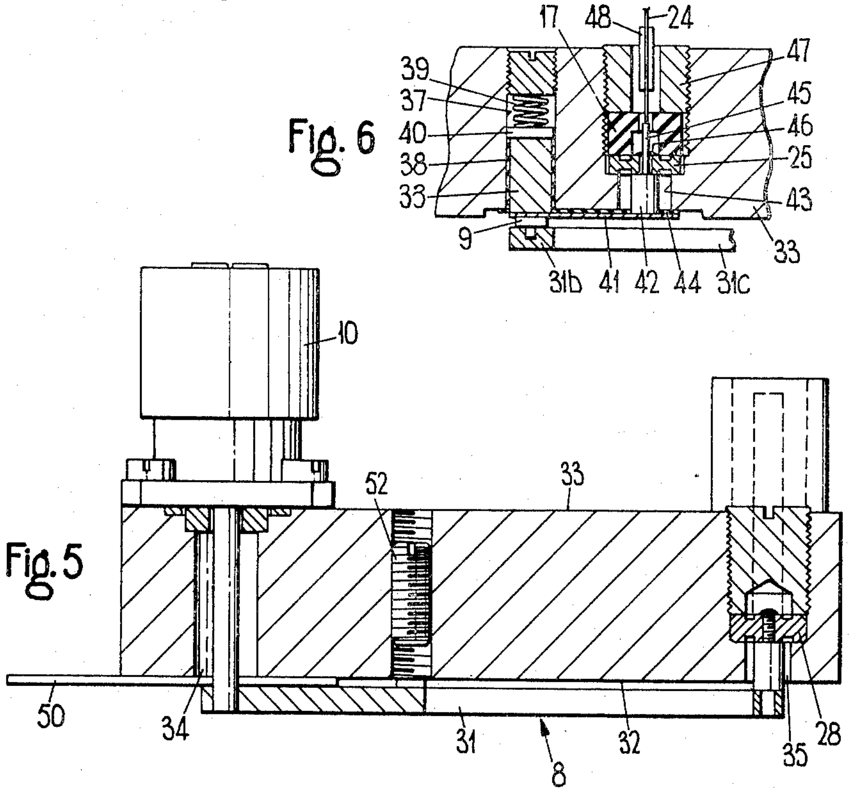
Figure 1:
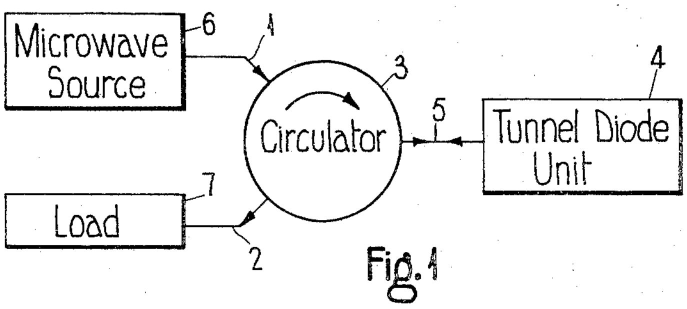
Figure 2:
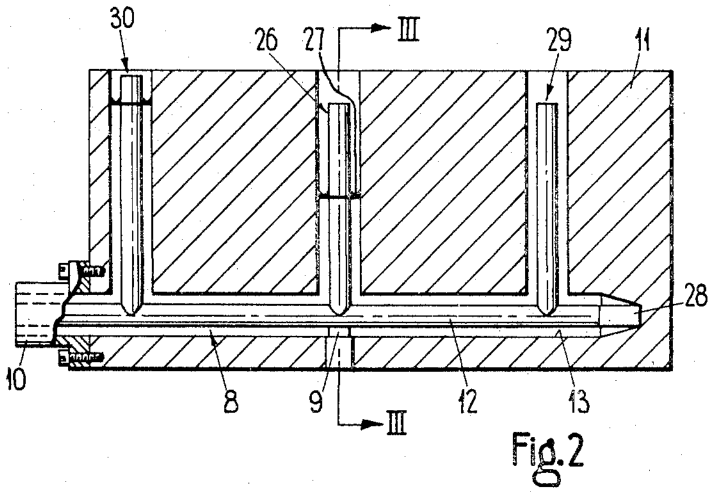
Figure 3:
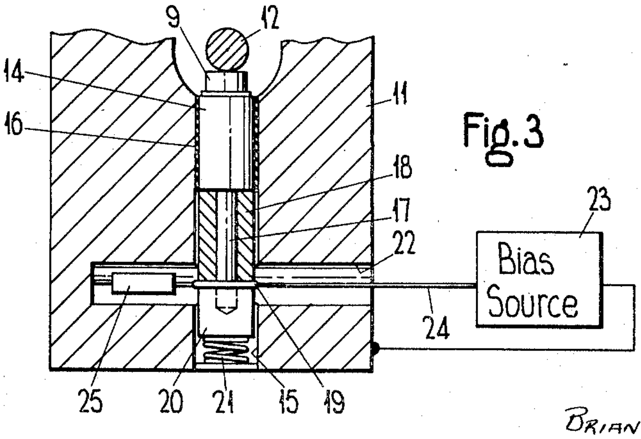

Two examples of microwave amplifier in accordance with the present invention will now be described with reference to the accompanying drawings in which:

FIGURE 1 shows diagrammatically the general arrangement of both types of amplifiers, FIGURE 2 shows a sectional plan view of part of the first example of amplifier, FIGURE 3 shows an enlarged fragmentary view at the line III—III in FIGURE 2, FIGURE 4 shows a plan view of part of the second example of amplifier, FIGURE 5 shows a sectional elevation at the line V—V in FIGURE 4, and FIGURE 6 shows a sectional elevation at the line VI—VI in FIGURE 4.

Referring now to FIGURE 1 of the drawings, each of the different types of amplifiers has an input path 1 and an output path 2 which are both of coaxial transmission line and which are connected respectively to two ports of a 3-port circular. A tunnel diode (which is not shown in FIGURE 1 but which forms part of the unit 4) is connected to the third port of the circulator 3 by way of a coaxial transmission line 5.

Basically the arrangement of FIGURE 1 operates so that a microwave signal supplied by a source 6 is passed to the tunnel diode by way of the input path 1, the circulator 3 and the transmission line 5. The tunnel diode is biased to operate on the negative resistance part of its characteristic so that it serves to amplify the microwave signal passed thereto. The amplified signal is passed to a load 7 by way of the transmission line 5, the circulator 3 and the output path 2.

Although not shown in FIGURE 1, one or other of the paths 1 and 2 may contain an isolator so as to ensure that the arrangement is not self-oscillatory. Alternatively the circulator 3 may be a 5-port device (which may conveniently consist of three interconnected 3-port circulators) with two ports resistively terminated in known manner.

Considering now in more detail the construction of the tunnel diode unit 4 of the first example of amplifier under consideration and referring to FIGURES 2 and 3 of the accompanying drawings, the unit 4 has a length of coaxial transmission line 8 which is connected to the transmission line 5 (FIGURE 1) by way of a connector 10 and across which the tunnel diode 9 is connected. The outer conductor of the length of transmission line 8 is formed by a metal block 11 and the inner conductor of this line is constituted by a metal rod 12 that lies in a hole 13. The tunnel diode 9 is of a so-called "pill" construction and is held between the inner conductor 12 and a cylindrical metal member 14 that lies in another hole 15 (FIGURE 3) in the block 11.

The narrow gap between the member 14 and the block 11 is filled with solid dielectric material, for example polytetrafluorethylene tape 16, to provide direct current insulation between the member 14 and the block 11. The electrical length of the auxiliary transmission line formed by this gap between the member 14 and the block 11 is, however, such, preferably slightly less than one quarter wavelength at the mean frequency of signals to be handled by the amplifier, that there is a low impedance path between the block 11 and the side of the tunnel diode 9 that is "connected" thereto as aforesaid. It will be appreciated, however, that the member 14 and the block 11 effectively constitute a blocking capacitor as far as direct current is concerned.

A metal rod 17 that is colinear with the member 14 is secured thereto and lies in the hole 15. The rod 17 carries a cylindrical plug 18 of lossy material, a metal disc 19 and a plunger 20 of solid dielectric material. A helical spring 21 which also lies in the hole 15 bears against the free side of the plunger 20 and urges the assembly thereof with the rod 17 and the member 14 so that the member 14 is pressed against the diode 9 thereby clamping the diode between the member 14 and the conductor 12.

Another hole 22 in the block 11 intersects the hole 15 in the region of the disc 19, portions of this hole 22 lying on either side of the hole 15. Bias for the tunnel diode 9 is supplied thereto from a source 23 by way of a feed wire 24 that passes through the hole 22, the disc 19, the rod 17 and the member 14, the other side of the bias source 23 being connected to the block 11. A resistor 25 lies in the other portion of the hole 22 and is connected between the block 11 and the disc 19. The resistor 25 may form part of a potentiometer chain the rest of which is contained within the bias source 23.

The plug 18 of lossy material may, for example, be synthetic resin loaded with iron powder. This lossy material serves effectively to terminate with a relatively high impedance the relatively low impedance transmission line formed by said annular gap between the block 11 and the member 14. It also helps to damp out undersirable resonances that might lead to instability of the amplifier.

Reverting now more particularly to the construction of the tunnel diode unit 4 shown in FIGURE 2, a stub 26 of coaxial transmission line is connected to the transmission line 8 opposite to the tunnel diode 9 so as effectively to be connected electrically in parallel with the diode. This stub 26 which is short-circuited at its end remote from the diode 9 by means of a plunger 27 has an electrical length somewhat less than a quarter wavelength at the mean operating frequency of the amplifier and is arranged to balance out in known manner the susceptance associated with the diode. Alternatively the stub 26 may be open-circuited at its remote end, its length then being approximately a half wavelength.

The end of the transmission line 8 remote from the connector 10 is terminated by a matched resistive load 28. Two additional stubs 29 and 30 of coaxial transmission line are connected to the transmission line 8 one on either side of the stub 26 at points spaced from the stub 26 by a distance equal to a quarter wavelength at the mean operating frequency of the amplifiers. The stub 29 which is connected to the transmission line 8 between the stub 26 and the resistive termination 28, is an open-circuited stub having electrical length equal to a quarter wavelength at the mean operating frequency of the amplifier and is provided to ensure stability for the amplifier. The stub 30 is a short-circuited stub having an electrical length of a quarter wavelength at the mean operating frequency of the amplifier and is provided to increase the operational bandwidth of the amplifier.

The gain of the amplifier at any particular frequency is dependent upon the total circuit susceptance across the tunnel diode 9 and in the absence of the stub 30 the change in susceptance of the stub 26 at frequencies slightly removed from said mean frequency has the effect of appreciably reducing the gain of the amplifier. The provision of the stub 30 spaced approximately a quarter wavelength from the stub 26 reduces this change of susceptance at such frequencies thereby increasing the operational bandwidth of the amplifier.

The transmission line 8 and the stubs 26, 29 and 30 may conveniently all have the same characteristic impedance.

The second example of tunnel diode amplifier in accordance with the present invention that is now to be described with reference to FIGURES 4, 5 and 6 of the accompanying drawings is basically similar to that described above with reference to FIGURES 2 and 3 and for convenience the same reference numerals will be used. In this case however the transmission line 8 is a strip line that is formed between a conductor 31 and the planar surface 32 of a metal block 33. As will be seen in FIGURE 4 the conductor 31 has four linear portions which are referenced 31A, 31B, 31C and 31D respectively. The two ends of the strip line 8 are connected to the connector 10 and to the resistive load 28 by way of lengths of coaxial transmission line 34 and 35 respectively.

The tunnel diode 9 is clamped between a cylindrical metal member 36 and the junction of the conductor portions 31B and 31C. The member 36 lies in a hole 37 in the block 33 and is insulated therefrom as far as direct current is concerned by a strip of dielectric tape 38. The member 36 is urged towards the diode 9 by means of a helical spring 37, a disc 40 of solid dielectric material being interposed between the spring 37 and the member 36.

For the purpose of biasing the diode 9, the member 36 is soldered to one end of a copper strip 41 the other end of this strip 41 being soldered to a cylindrical metal member 42 that lies in another hole 43 in the block 33. The strip 41 is insulated from the block 33 by means of a strip 44 of dielectric tape. A pin 45 is integral with the member 42 and projects through the resistance element 25 to which it is soldered at the point 46. The plug 17 which is of lossy dielectric material is pressed against the resistance element 25 by a screw bush 47. The wire 24 is soldered to the free end of the pin 45 and is insulated from the bush 47 by a sleeve 48.

The plug 17 and the element 25 serve to terminate the auxiliary transmission line formed by the strip 41 and the block 33 and the plug 17 absorbs any microwave energy that is passed beyond the element 25. In one example for use at frequencies of the order of 2,000 megacycles per second, the strip 41 has a width of 0.25 inch and is spaced from the block 33 by tape 44 having a thickness of 0.005 inch so that this auxiliary transmission line has a low characteristic impedance compared with the resistance of the diode 9.

The stub 26 in this embodiment is of strip line formed between a conductor 49 that is integral with the conductor 31 and the surface 32 of the block 33. The effective length of the stub 26 may be adjusted by moving a slotted member 50 which serves to bridge the stub, this member being locked in position when the stub has been correctly adjusted by means of a nut 51. A further adjustment is provided by a screw 52 which enables the capacity across the transmission line 8 at the junction of the conductor portions 31A and 31B to be varied.

I claim:

1. A microwave amplifier comprising a main two-conductor transmission line which constitutes the path over which microwave signals are fed to and from the amplifier, a negative-resistance element, an auxiliary two-conductor transmission line having a low characteristic impedance compared with the resistance of said element, means to connect one end of said auxiliary transmission line which acts as a direct current blocking capacitor in series with said element between the two conductors of said main transmission line, a mass of lossy material terminating the other end of said auxiliary transmission line to damp out unwanted resonances and thereby prevent parasitic oscillation of the amplifier, and a bias conductor which passes through said mass of lossy material and which is connetced to one conductor of the auxiliary transmission line at said other end for supplying bias to said element.

2. A microwave amplifier according to claim 1 wherein said main transmission line across which said element is connected is a coaxial line.

3. A microwave amplifier according to claim 1 wherein said main transmission line across which said element is connected is a strip line.

4. A microwave amplifier according to claim 1 wherein said element and said mass of lossy material are respectively located in two holes in a metal block and said auxiliary transmission line is provided by said block and an electrically conducting member that lies close to but insulated from a surface of said block.

References Cited

UNITED STATES PATENTS

| | | | |
|---|---|---|---|
| 3,160,826 | 12/1964 | Marcatili | 330—61 |
| 3,182,203 | 5/1965 | Miller | 330—61 X |
| 3,212,018 | 10/1965 | Amoss et al. | 330—56 X |
| 3,248,662 | 4/1966 | Brownell et al. | 330—61 |

NATHAN KAUFMAN, Primary Examiner

U.S. Cl. X.R.

330—53